United States Patent [19]

Palmer

[11] Patent Number: 5,721,454
[45] Date of Patent: Feb. 24, 1998

[54] INTEGRATED CIRCUIT PACKAGE WITH A PLURALITY OF VIAS THAT ARE ELECTRICALLY CONNECTED TO AN INTERNAL GROUND PLANE AND THERMALLY CONNECTED TO AN EXTERNAL HEAT SLUG

[75] Inventor: Mark J. Palmer, Phoenix, Ariz.

[73] Assignee: Intel Corporation, Santa Clara, Calif.

[21] Appl. No.: 575,222

[22] Filed: Dec. 20, 1995

[51] Int. Cl.⁶ .................................................. H01L 23/12
[52] U.S. Cl. ........................ 257/700; 257/703; 257/706; 257/774
[58] Field of Search ........................... 257/700, 703, 257/705, 706, 774

[56] References Cited

U.S. PATENT DOCUMENTS 5,543,661  8/1996  Sumida ........................... 257/706

FOREIGN PATENT DOCUMENTS 0375461  6/1990  European Pat. Off. ............ 257/700
60-66842  4/1985  Japan ............................... 257/705

*Primary Examiner*—Tom Thomas
*Assistant Examiner*—Roy Potter
*Attorney, Agent, or Firm*—Blakely, Sokoloff, Taylor & Zafman

[57] ABSTRACT

An integrated circuit package which has vias that provide the dual function of electrically grounding an integrated circuit and removing heat generated by the circuit. The package has a bonding shelf extending from a base portion. The bonding shelf has a plurality of bonding pads that are connected to corresponding pads on a top surface of the integrated circuit. The integrated circuit is mounted to the base portion of the package. The base portion has a plurality of surface pads that are connected to corresponding ground pads on the integrated circuit. Located between the base portion and an external bottom surface of the package is a ground bus. The package has a plurality of vias that electrically connect the surface pads and integrated circuit to the ground bus. The vias further extend to the external bottom surface to provide a thermal path between the integrated circuit and the outside of the package.

13 Claims, 1 Drawing Sheet

INTEGRATED CIRCUIT PACKAGE WITH A PLURALITY OF VIAS THAT ARE ELECTRICALLY CONNECTED TO AN INTERNAL GROUND PLANE AND THERMALLY CONNECTED TO AN EXTERNAL HEAT SLUG

BACKGROUND OF THE INVENTION

1. Field of the Invention

The present invention relates to an electronic package.

2. Description of Related Art

Integrated circuits are typically housed within a plastic or ceramic package. The package has external contacts that are soldered to a printed circuit board. The external contacts are coupled to the integrated circuit by routing lines located within the package. The routing lines may be provided by a lead frame encapsulated by a plastic package or conductive traces and busses that are etched into a ceramic package. For packages with a relatively large number of output pins, the traces and busses are typically formed in a number of layers physically separated within the package. The separate layers are interconnected by vias. Vias are typically created by initially creating holes in the dielectric material of the package and then plating the holes with a conductive material such as copper. Vias are relatively expensive to produce. It is therefore desirable to provide an integrated circuit package which optimizes the number of vias within the package.

Integrated circuits generate heat which must be removed from the package to maintain the junction temperatures of the circuits below a critical value. The heat generated by the circuits typically conducts through the package material and is removed through forced and/or natural gravity convection. Large integrated circuits such as microprocessors generate a relatively large amount of heat. Conventional ceramic package material has a relatively low coefficient of thermal conductivity which creates a corresponding large temperature differential between the electronic device and the external surface of the package. To reduce the thermal resistance of the package and lower the junction temperatures of the integrated circuit, some packages are provided with a heat slug that is coupled to the circuit die. Heat slugs require an additional process step that increases the cost of producing the package. It would be desirable to provide an integrated circuit package which is thermally efficient and optimizes the use of vias in the package.

SUMMARY OF THE INVENTION

The present invention is an integrated circuit package which has vias that provide the dual function of electrically grounding an integrated circuit and removing heat generated by the circuit. The package has a bonding shelf extending from a base portion. The bonding shelf has a plurality of bonding pads that are connected to corresponding pads on a top surface of the integrated circuit. The integrated circuit is mounted to the base portion of the package. The base portion has a plurality of surface pads that are connected to corresponding ground pads on the integrated circuit. Located between the base portion and an external bottom surface of the package is a ground bus. The package has a plurality of vias that electrically connect the surface pads and integrated circuit to the ground bus. The vias further extend to the external bottom surface to provide a thermal path between the integrated circuit and the outside of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
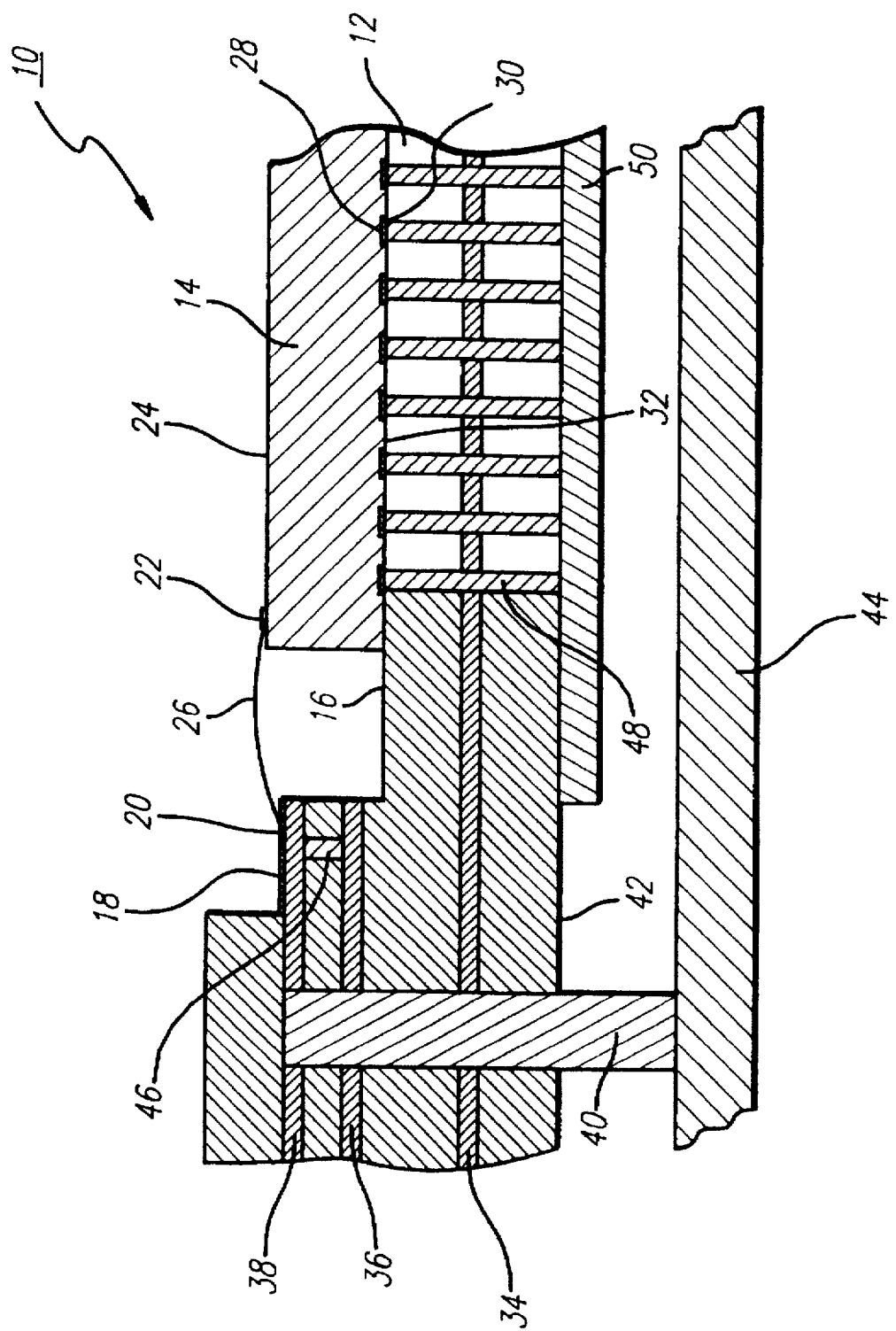
FIG. 1 is a cross-sectional view of an integrated circuit package of the present invention.

Referring to the drawings more particularly by reference numbers, FIG. 1 shows an integrated circuit package assembly 10. The assembly 10 includes a package 12 that houses an integrated circuit 14. The integrated circuit 14 may be a microprocessor. Although an integrated circuit 14 is shown and described, it is to be understood that the package 12 may house any active or passive electrical device.

The package 12 has a base area 16 and a bonding shelf 18. Located on the bonding shelf 18 are a plurality of bonding pads 20 that are connected to corresponding pads 22 on a top surface 24 of the integrated circuit 14. The pads 20 and 22 may be connected by bonding wires 26, tape automated bonding (TAB) tape (not shown) or any other means of interconnect. The pads 22 are typically dedicated to power and digital signals for the integrated circuit 14.

The integrated circuit 14 is mounted to the base 16 of the package 12. The base 12 has a plurality of surface pads 28 that are connected to corresponding solder pads 30 located on a bottom surface 32 of the integrated circuit 14. The pads 30 located on the bottom surface 32 typically provide an electrical ground for the integrated circuit 14.

The package 12 includes a plurality of conductive layers 34-38 formed therein. Conductive layer 34 may be dedicated to electrical ground. Conductive layer 36 may be a plurality of individual traces that are dedicated to digital signals. Conductive layer 38 may be dedicated to power. The ground layer 34 is located between the base 16 and an external bottom surface 42 of the package 12. Although only one digital signal layer is shown and described, it is to be understood that the package 12 may have multiple digital layers 36.

The conductive layers 34-38 are connected to pins 40 that extend from the bottom surface 42 of the package 12. The pins 40 are typically soldered to an external printed circuit board 44. Although pins 40 are shown and described, it is to be understood that the package 12 may have solder pads (not shown) that are soldered to the printed circuit board.

The package 12 has a plurality of first vias 46 that interconnect the layers 34-38. The first vias 46 also connect the bonding pads 20 to the layers 34-38 to provide an electrical path from the integrated circuit 14 to the pins 40.

The package 12 also has a plurality of second vias 48 that connect the surface pads 28 to the ground layer 34 to provide an electrical path from the ground pads 30 of the integrated circuit 14 to the ground bus 34 of the package 12. The second vias 48 further extend to the bottom surface 42 of the package 12 to provide a thermal path between the integrated circuit 14 and the external surface of the package 12.

The second vias 48 provide a dual function of providing an electrical path between the integrated circuit 14 and the ground bus 34, and a thermal path for the heat generated by the integrated circuit 14. A heat slug 50 may connected to the bottom surface 42 of the package to more evenly distribute the heat transferred by the second vias 48. The heat slug 50 is preferably constructed from a thermally conductive material such as copper or aluminum.

The package 12 is preferably constructed from a co-fired ceramic material, wherein the layers and vias are formed with conventional etching and plating processes. After the package 12 is fired, a solder paste may be applied to the surface pads 28. The integrated circuit 12 is then mounted to the package and the solder paste is heated and reflowed to attach the pads 28 and 30. The bonding pads 20 are connected to the integrated circuit 14, which is then enclosed by a lid or encapsulant (not shown).

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package for an integrated circuit, comprising:
    a package that has a bottom surface and a base portion that is adapted to support the integrated circuit;
    a plurality of surface pads located on said base portion of said package;
    a conductive plane located within said package between said surface pads and said bottom surface;
    a plurality of vias that are connected to said surface pads and extend vertically to said bottom surface, said vias also being connected to said conductive plane; and,
    a heat slug that is attached to said bottom surface and said vias.

2. The package as recited in claim 1, wherein said conductive plane is an electrical ground path.

3. The package as recited in claim 1, further comprising a plurality of pins that are connected to said conductive plane and extend from said package.

4. The package as recited in claim 1, wherein said conductive plane is an electrical ground path.

5. The package as recited in claim 4, further comprising a plurality of pins that are connected to said conductive plane and extend from said package.

6. An electronic package, comprising:
    a package that has a bottom surface;
    a plurality of surface pads located on said base portion of said package;
    an integrated circuit mounted to and supported by said base portion of said package and electrically connected to said surface pads;
    a conductive plane located within said package between said surface pads and said bottom surface;
    a plurality of vias that are connected to said surface pads, and extend vertically to said bottom surface, said vias also being connected to said conductive plane; and,
    a heat slug that is attached to said bottom surface and said vias.

7. The package as recited in claim 6, wherein said conductive plane is an electrical ground path.

8. The package as recited in claim 6, further comprising a plurality of pins that are connected to said conductive plane and extend from said package.

9. The package as recited in claim 6, wherein said conductive plane is an electrical ground path.

10. The package as recited in claim 9, further comprising a plurality of pins that are connected to said conductive plane and extend from said package.

11. The electronic package of claim 6, wherein said package includes a bonding shelf.

12. The electronic package of claim 11, wherein said package includes a plurality of bonding pads.

13. The electronic package of claim 12, wherein said integrated circuit is electrically connected to said bonding pads.

* * * * *